United States Patent [19]
Ashida

[11] Patent Number: 5,949,809
[45] Date of Patent: Sep. 7, 1999

[54] SEMICONDUCTOR LASER DEVICE AND METHOD FOR MANUFACTURING THE SAME

[75] Inventor: Masayoshi Ashida, Kyoto, Japan

[73] Assignee: Rohm Co., Ltd., Kyoto, Japan

[21] Appl. No.: 08/935,890

[22] Filed: Sep. 23, 1997

[30] Foreign Application Priority Data

Sep. 25, 1996 [JP] Japan .................................. 8-252567

[51] Int. Cl.$^6$ ...................................................... H01S 3/19
[52] U.S. Cl. ............................................................. 372/46
[58] Field of Search ........................................ 372/46, 45

[56] References Cited

U.S. PATENT DOCUMENTS 5,661,741  8/1997  Kakimoto .................................. 372/45

*Primary Examiner*—James W. Davie
*Attorney, Agent, or Firm*—Nikaido Marmelstein Murray & Oram LLP

[57] ABSTRACT

A semiconductor laser device is of a double-hetero structure having an active layer sandwiched between a first conductivity type cladding layer and a second conductivity type cladding layer, one of the first and second conductivity type cladding layers being formed by a first cladding layer and a second cladding layer. A current blocking layer is provided between the first cladding layer and the second cladding layer, and formed of a material having a forbidden band gap wider than that of the active layer and a refractive index lower than that of the one cladding layer, the current blocking layer being formed with a current injecting region having a conductivity type different from that of the one cladding layer. An over-saturation absorbing layer is formed in the current blocking layer, the over-saturation absorbing layer is formed of such a material that has approximately the same forbidden band gap as that of the active layer. It is possible to set independently the distance between the active layer and the over-saturation absorbing layer as well as the distance between the active layer and the current blocking layer, so as to provide device operation on a low operating current (lowered threshold value) with low noise and astigmatism in a multi mode instead of a longitudinal mode.

10 Claims, 4 Drawing Sheets

SEMICONDUCTOR LASER DEVICE AND METHOD FOR MANUFACTURING THE SAME

BACKGROUND OF THE INVENTION

This invention relates to a semiconductor laser device and a method for manufacturing the same. More particularly, this invention relates to a semiconductor laser device that is adapted to operate on self-excited oscillation in a multi mode, instead of a longitudinal mode, at low return-light noise and reduced astigmatism, as well as a method for manufacturing the same.

There is known so-called a double-hetero semiconductor laser device having an active layer sandwiched between a first conductivity type cladding layer and a second conductivity type cladding layer. In a double-hetero device structure having a current blocking layer formed of a material with a narrow forbidden band gap, if the distance between the current blocking layer and the active layer is small, the device behaves as a refractive-index guiding structure to cause oscillation in a single longitudinal mode, thereby enhancing coherence.

On the other hand, if the distance between the current blocking layer and the active layer is so wide as not to absorb a portion of the light created by the active layer, the device behaves as a gain guiding structure giving no lateral difference in refractive index, making possible reduction of return-light noise. In such a structure, however, there is increase of astigmatism in unstable lateral mode, thus resulting in causing phenomenon of kink. Under such situations, efforts have being made for obtaining a semiconductor laser device that has an over-saturation absorbing layer formed in the cladding layer in a manner separated from the current blocking layer, in order to optimize the distance thereto from the active layer. In such a structure, characteristics of both the above-mentioned structures are satisfied, thereby reducing return-light noise as well as astigmatism. Semiconductor laser devices having a structure like this have been disclosed, e.g., by Japanese Provisional Patent Publications (Kokai) Nos. H7-86676 and H6-196810, that are adapted to cause self-excited oscillation in a multi mode instead of a longitudinal mode.

The semiconductor laser device of this kind is constructed as shown for example in FIG. 4 and FIG. 5. In the figures, reference character 21 denotes an n-type GaAs substrate, 22 (22a, 22b) is a first conductivity (n) type AlGaAs cladding layer, 23 is a non-doped $Al_aGa_{1-a}As$ ($0 \leq a \leq 0.3$) active layer, 24 (24a, 24b, 24c) is a second conductivity (p) type AlGaAs cladding layer, and 26 is an n-type GaAs current blocking layer, 27 is a $Al_bGa_{1-b}As$ ($0 \leq b \leq 0.3$) over-saturation absorbing layer. Over the second conductivity type cladding layer 24, a cap layer and a contact layer, both not shown, are provided. Top and bottom electrodes are respectively provided on top and bottom surfaces of the substrate having respective layers thus formed thereon, which are not shown. In this structure, the layers are formed such that the distance d between the over-saturation absorbing layer 27 and the active layer 23 is set to an optimum value so as to provide self-excited oscillation to bring the longitudinal mode into a multi mode. This realizes a low-noise characteristic.

In this structure, however, the over-saturation absorbing layer is provided between the current absorbing layer and the active layer. Consequently, where the distance d between the active layer and the over-saturation absorbing layer increases, the distance between the active layer and the current blocking layer also becomes distant. However, if the distance between the current blocking layer and the active layer is far, an electric current once narrowed by the current blocking layer spreads before reaching the active layer, being scattered to a certain extent in the cladding layer. As a result, the density of the current to the active layer decreases at its light emitting portion, raising a problem that operating current requirement and hence a consumption power are increased.

In the meanwhile, if the current blocking layer and the over-saturation absorbing layer are placed on opposite sides with respect to the active layer, the location of the current blocking layer is not affected by the restriction due to the over-saturation absorbing layer. However, where the current blocking layer and the over-saturation absorbing layer are placed on the opposite side in this manner, the light created is attracted by the over-saturation absorbing layer, and the light is distant from the current blocking layer. However, if no light comes to the current blocking layer, the difference in refractive index between the cladding layer and the current blocking layer decreases, and there arises a problem that the light confining effect is lessened with increased astigmatism. In order to reduce the astigmatism for the laser device, there is necessity that the current blocking layer and the over-saturation absorbing layer have to be arranged on the same side relative to the active layer.

SUMMARY OF THE INVENTION

It is therefore the object of the present invention to provide a semiconductor laser device wherein it is possible to set independently the distance between the active layer and the over-saturation absorbing layer as well as the distance between the active layer and the current blocking layer while providing the current blocking layer and the over-saturation absorbing layer on a same side with respect to the active layer, providing operation in a multi mode, instead of a longitudinal mode, on a low operating current (lowered threshold value) at low noise and reduced astigmatism.

In accordance with the present invention, there is provided a semiconductor laser device comprising: (a) a double-hetero structure having an active layer sandwiched between a first conductivity type cladding layer and a second conductivity type cladding layer, one of the first and second conductivity type cladding layers being formed by a first cladding layer and a second cladding layer; (b) a current blocking layer provided between the first cladding layer and the second cladding layer, and formed of a material having a forbidden band gap wider than that of the active layer and a refractive index lower than that of the one cladding layer, the current blocking layer being formed with a current injecting region having a conductivity type different from that of the one cladding layer; and (c) an over-saturation absorbing layer formed in the current blocking layer, the over-saturation absorbing layer is formed of such a material that has approximately the same forbidden band gap as that of the active layer. Consequently, almost no light is absorbed by the current blocking layer and there is no problem, concerning light absorption, on the distance between the current blocking layer and the active layer. It is therefore possible to control independently the distance between the active layer and the over-saturation absorbing layer as well as the distance between the active layer and the current blocking layer. By providing the current blocking layer and the active layer close to each other, the density of current to be injected to the active layer is increased to lower the device operating current. The optimization in the distance between the current blocking layer and the active layer provides a multi mode instead of a longitudinal mode, thereby reducing return-light noise and astigmatism.

Here, the first conductivity type and the second conductivity type means that, where one of "n" and "p" semiconductor conductivity types are taken as a first conductivity type, the other is of a second conductivity type.

Preferably, an etch stop layer of a material having a forbidden band gap wider than that of the active layer is included between the current blocking layer and the first cladding layer, the etch stop layer being etchable at an etching rate lower than those of the current blocking layer and the over-saturation absorbing layer when using an etching solution for etching the current blocking layer and the over-saturation absorbing layer. This makes possible etching solely on the current blocking layer and the over-saturation absorbing layer with accuracy.

Here, the low etching rate means that the difference in such etching rate is present that a material to be etched is to be selectively etched.

It is possible to form the active layer in a quantum well structure.

In one detailed form, a semiconductor laser device comprises: a first conductivity type semiconductor substrate; a first conductivity type cladding layer formed on the first conductivity type semiconductor substrate; an active layer formed on the first conductivity type cladding layer; a second conductivity type cladding layer formed on the active layer; a first conductivity type first current blocking layer, an over-saturation absorbing layer and a first conductivity type second current blocking layer being formed in the order in the second conductivity type cladding layer to have a stripe groove formed therein; wherein the first and second current blocking layers are formed of a material having a forbidden band gap wider than that of the active layer and a refractive index lower than that of the second conductivity type cladding layer; and the over-saturation absorbing layer being formed of a material having a forbidden band gap approximately equivalent to that of the active layer.

In another detailed form, a semiconductor laser device comprises: a first conductivity type semiconductor substrate; a first conductivity type cladding layer formed on the first conductivity type semiconductor substrate; an active layer formed on the first conductivity type cladding layer; a second conductivity type cladding layer formed on the active layer; a current injecting region formed by selectively removing the second conductivity type cladding layer at an upper portion on respective sides; a first conductivity type first current blocking layer, an over-saturation absorbing layer and a first conductivity type second current blocking layer formed on the respective sides of the current injecting region; wherein the first and second current blocking layers are formed of a material having a forbidden band gap wider than that of the active layer and a refractive index lower than the second conductivity type cladding layer; and the over-saturation absorbing layer being formed of a material having a forbidden band gap approximately equivalent to that of the active layer.

More specifically, the cladding layers are formed of $Al_xGa_{1-x}As$ ($0.4 \leq x \leq 0.6$), the active layer being formed of $Al_pGa_{1-p}As$ ($0 \leq p \leq 0.3$), the current blocking layers being formed of $Al_qGa_{1-q}As$ ($0.5 \leq q \leq 0.8$, $p<q$, $x<q$), and the over-saturation absorbing layer being formed of $Al_rGa_{1-r}As$ ($0 \leq r \leq 0.3$, p and r are approximately equivalent).

In accordance with the present invention, there is also provided a method for manufacturing a semiconductor laser device, comprising the steps of: (d) forming in order on a semiconductor substrate a first conductivity type cladding layer, an active layer, a second conductivity type first cladding layer, a first conductivity type first current blocking layer of a material having a forbidden band gap wider than that of the active layer and a refractive index lower than that of the first cladding layer, an over-saturation absorbing layer of a material having a forbidden band gap approximately equivalent to that of the active layer, and a first conductivity type second current blocking layer; (e) etching the first and second current blocking layers and the over-saturation absorbing layer into a stripe form defining a current injecting region; (f) forming a second conductivity type second cladding layer in a manner filling the current injecting region. With this method, it is possible to readily manufacture a laser device through a two-stages of growth processes at low cost but high manufacture yield.

In another form, a method for manufacturing a semiconductor laser device, comprises the steps of: (d') forming in order on a semiconductor substrate a first conductivity type cladding layer, an active layer, a second conductivity type cladding layer; (e') etching the second conductivity type cladding layer at an upper portion on respective sides thereof in a manner leaving a region for defining a current injecting region; (f') forming in order, on portions at which the second conductivity type cladding layer is removed by the etching, a first conductivity type first current blocking layer of a material having a forbidden band gap wider than that of the active layer and a refractive index lower than that of the second conductivity type cladding layer, an over-saturation absorbing layer of a material having a forbidden band gap approximately equivalent to that of the active layer, and a first conductivity type second current blocking layer; and (g) forming a contact layer thereon. With this method, there is necessity of a three-stages of growth processes. However, this method is capable of providing a reliable laser device that has an interface of regrowth located distant from the active layer.

The above described objects and other objects, features, aspects and advantages of the present invention will become more apparent from the following detailed description of the present invention when taken in conjunction with the accompanying drawings.

DETAILED DESCRIPTION

Figure 1:
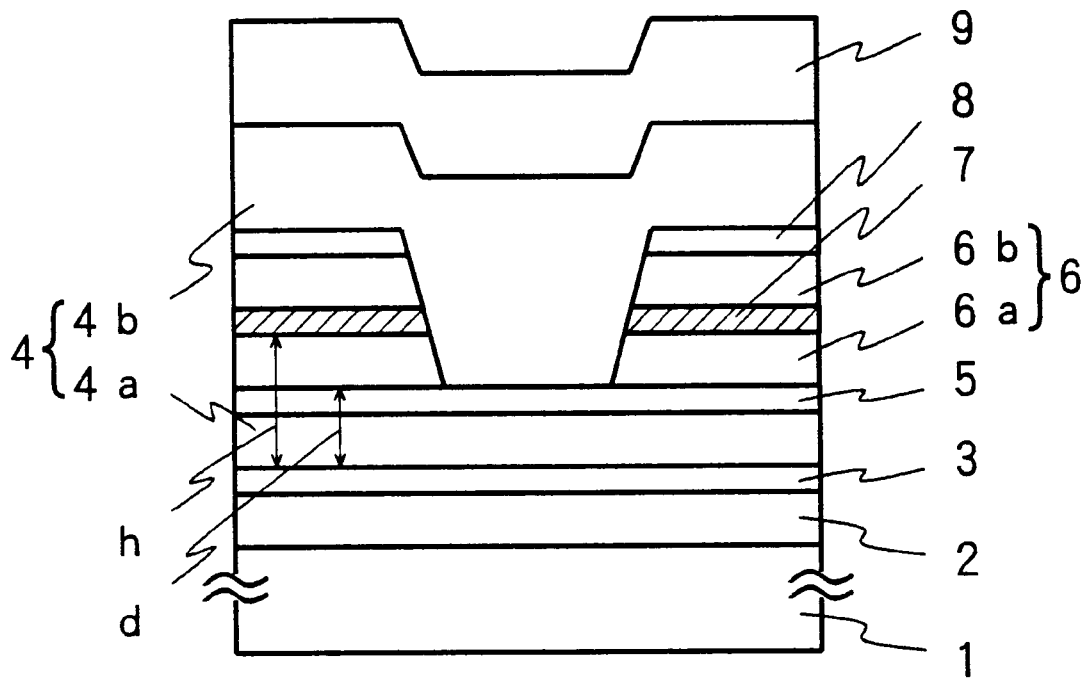
FIG. 1 is a sectional view of a semiconductor laser device according to one embodiment of the present invention.

Referring to FIG. 1, there is illustrated a semiconductor laser device according to one embodiment of the present invention. The laser device is of a doublehetero structure including an active layer 3, and first and second conductivity type cladding layers 2, 4 cooperating to sandwich the active layer 3 therebetween. In one cladding layer 4, current blocking layers 6a, 6b are formed to provide a current injecting region. That is, the current blocking layers 6a, 6b are formed of a material that is wider in forbidden band gap than the active layer 3 and lower in refractive index than that of the active layer 3. Between the current blocking layers 6a, 6b, an over-saturation absorbing layer 7 is formed of a material having generally a forbidden band gap approximately equivalent to that of the active layer 3.

More specifically, the cladding layer 2 is formed of $Al_xGa_{1-x}As$ ($0.4 \leq x \leq 0.6$) in a first (or n) conductivity type overlying an n-GaAs semiconductor substrate 1. An active layer 3 is formed of non-doped $Al_pGa_{1-p}As$ ($0 \leq p \leq 0.3$) overlying the cladding layer 2. A first cladding layer 4a is formed of $Al_xGa_{1-x}As$ in a second (or p) conductivity type overlying the active layer 3. An etch-stop layer 5 is formed of a non-doped InGaAlP-base material, e.g., $In_{0.5}Ga_{0.4}Al_{0.1}P$, overlying the first cladding layer 4a. A first current blocking layer 6a is formed of n-$Al_qGa_{l-q}As$ ($0.5 \leq q \leq 0.8$, p<q, x<q) overlying the etch-stop layer 5. An over-saturation absorbing layer 7 is formed of non-doped $Al_rGa_{1-r}As$ ($0 \leq r \leq 0.3$, p and r are almost equal) overlying the first current blocking layer 6a. A second current blocking layer 6b is formed of n-$Al_qGa_{1-q}As$ ($0.5 \leq q \leq 0.8$, p<q, x<q) overlying the over-saturation absorbing layer 7. Further, an oxidation-preventive layer 8 is formed of n-GaAs overlying the second current blocking layer 6b.

A stripe groove is formed by selectively etching away the current blocking layer 6 and the over-saturation absorbing layer 7 from a surface of the oxidation-preventive layer 8, to thereby providing a current injecting region there. Note that in the figure the stripe groove is depicted as a recess form in its cross section. A second cladding layer 4b, is formed of $Al_xGa_{1-x}As$ in the second (p) conductivity type overlying the layers thus etched. Further, a contact layer 9 is formed of p-GaAs overlying the second cladding layer 4b. A top electrode, not shown, is formed on a surface of the contact layer 9, whereas a bottom electrode, not shown, is formed on a back surface of the semiconductor substrate 1. In this manner, a semiconductor laser device of the invention is structured.

In the present invention, the current blocking layer 6 (6a, 6b) is formed of a material that has a forbidden band gap wider than that of the active layer 3 so that the light created by the active layer is hardly absorbed by the current blocking layer 6. Note that, for the AlGaAs-base material in the above example, as the Al mixed crystal ratio increases, the forbidden band gap increases and the refractive index decreases. The current blocking layer 6 (6a, 6b) is formed of a material lower in refractive index than that of the second cladding layer 4 (4a, 4b) to thereby constitute a refractive index guiding structure (the structure that confines light without loss of absorption by the current blocking layer 6). The current blocking layer 6 is for injecting an electric current into the stripe groove and prohibiting current flow through other portions, and in a conductivity type opposite to that of the cladding layer having the current blocking layer 6 therein. Therefore, the current blocking layer 6 is of the p-type where it is provided in the n-type cladding layer.

The over-saturation absorbing layer 7 provided in the current blocking layers 6 is formed of a material that is approximately equivalent in forbidden band gap to the active layer 3. Consequently, the over-saturation absorbing layer 7 absorbs the infiltrating, or spreading, portion of the light created by the active layer 3. By placing the over-saturation absorbing layer 7 at the optimum distance from the active layer 3, self-excited oscillation is caused to occur in the active layer 3. That is, when an electric current is narrowed by the current blocking layer 6 to be injected into the stripe groove, laser oscillation occur in the active layer 3 to thereby emit a laser light. Thereupon, the creation of light causes lowering in absorption coefficient for the over-saturation absorbing layer 7, thereby halting the oscillation. The repetition of oscillation and cease thereof causes periodical variation in the refractive index of the light creating portion of the active layer 3. This variation in the refractive index is resultantly reflected as a variation in oscillation wavelength, bringing the longitudinal mode into a multi mode. The over-saturation absorbing layer 7 is satisfactory if it can afford to absorb the infiltrated portion of the light created by the active layer 3 so that the thickness thereof is satisfactorily determined approximately 0.01 to 0.03 μm.

If the distance d between the first current blocking layer 6a and the active layer 3 is taken too large, the current narrowed by the current blocking layer 6 spreads before reaching the active layer 3, resulting in decrease in current density and lowering in light emitting efficiency. Conversely, if the distance d is too small, there arises generally a problem that the light created by the active layer 3 is excessively absorbed by the current blocking layer 6. So the distance d in usual cases is taken greater than a certain value. In the present invention, however, since the current blocking layer 6 is of the material having a forbidden band gap greater than that of the active layer 3, there is no problem of light absorption and accordingly the current blocking layer 6 is placed closer to the active layer 3. As a result, the current injection through the stripe groove to the active layer 3 can be controlled with higher efficiency. The distance d in this example is determined approximately 0.1 to 0.2 μm.

Meanwhile, if the distance h between the over-saturation absorbing layer 7 and the active layer 3 is too large, there becomes no absorption of the infiltrated portion of the light emitted by the active layer 3, resulting in a gain guiding structure offering no self-excited oscillation. On the other hand, if the distance h is too small, the absorption of the light becomes excessive without attaining self-excited oscillation, lowering the light emitting efficiency. If the distance h is set at an appropriate value, the refractive index for the light creating portion is varied to oscillate due to the interaction between the infiltrating portion of the light given from the active layer 3 and carriers, hereby attaining self-excited oscillation. However, if he distance h is not set at such an optimum value that appropriately absorbing the infiltrating portion of the light, no self-excited oscillation is available and accordingly the shift of the longitudinal mode into the multi mode is not to be attained. However, it is possible in the present invention to determine the location of the over-saturation absorbing layer 7 regardless of the position of the current blocking layer 6. Therefore, the distance h between the over-saturation absorbing layer 7 and the active layer 3 can be given with accuracy to its design value. The distance h is ordinarily set at approximately 0.2 to 0.3 μm, though it may be different by the composition ratio q of the current blocking layer 6 as well as the above-mentioned distance d.

The etch stop layer 5 is for preventing the first cladding layer 4a of the second conductivity type from being etched when the current blocking layer 6 is formed by etching into a stripe shape. To meet with this, a low etch rate material is employed for the etch stop layer 5 so that the etch stop layer 5 does not undergo etching by an etch solution at all or is etched at a sufficient low etch rate relative to the etching, with using an etch solution, on the current blocking layer 6 and the over-saturation absorbing layer 7. The material for the etch stop layer 5 has a forbidden band gap wider than that of the active layer 3, due to the requirement that the infiltrating portion of the light oscillating in the active layer 3 is not absorbed.

According to the present invention, since the material of the current blocking layer 6 (6a, 6b) has a forbidden band gap wider than that of the active layer 3, the current blocking layer 6 can be provided close sufficient to the active layer 3 without absorbing the infiltrating portion of the light created by the active layer 3. This serves to increase the density of current to be injected into the active layer 3, making possible operation of the device at low operating current. Furthermore, the over-saturation absorbing layer 7 is provided in the current blocking layer 6 at such an optimum distance h from the active layer 3 that is not afected by the position of the current blocking layer 6 but induces self-excited oscillation within the active layer 3. It is therefore possible to cause self-excited oscillation that oscillation and cease are alternately repeated at constant and balanced timing, thereby bringing the longitudinal mode into the multi mode.

Although in the above embodiment the active layer 3 was formed of $Al_pGa_{1-p}As$, it may alternatively be formed by a quantum well structure. In such a case, it is also possible to cause self-excited oscillation with low astigmatism at a low operating current, if the Al composition ratio r is selected to such a value that the forbidden band gap of the over-saturation absorbing layer 7 becomes almost equivalent to an oscillation wavelength energy. Furthermore, in the above embodiment the AlGaAs-base material is used for a semiconductor laser device material. However, the present invention is not limited to such a material but can be constructed by other semiconductor materials such as an InGaAlP-base material.

The method of manufacturing the semiconductor laser device according to the present invention will then be explained with reference to FIG. 2(a) to FIG. 2(c).

Figure 2:
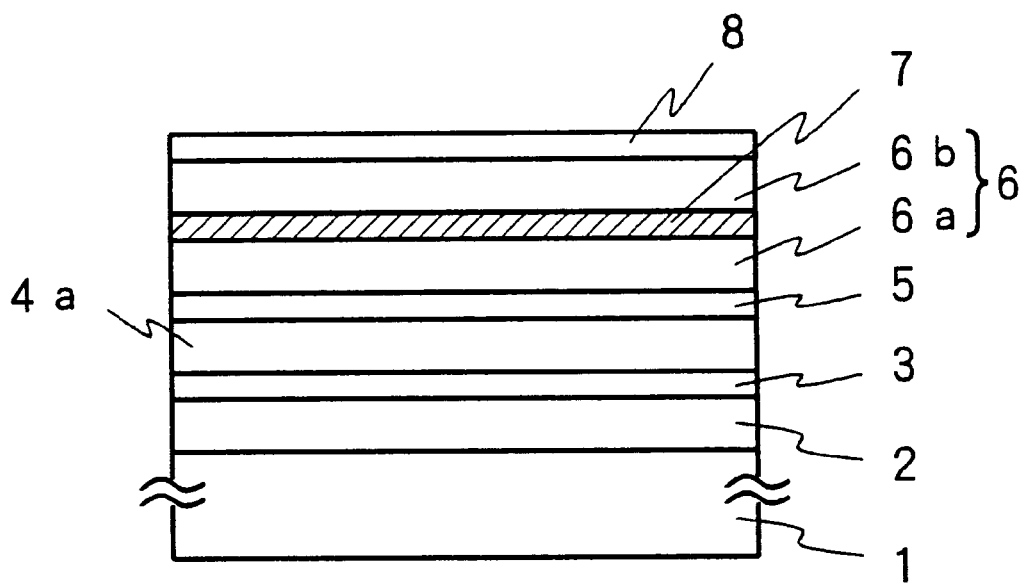
FIGS. 2(a) to 2(c) are sectional views showing a process for manufacturing the laser device of FIG. 1.
Figure 2:
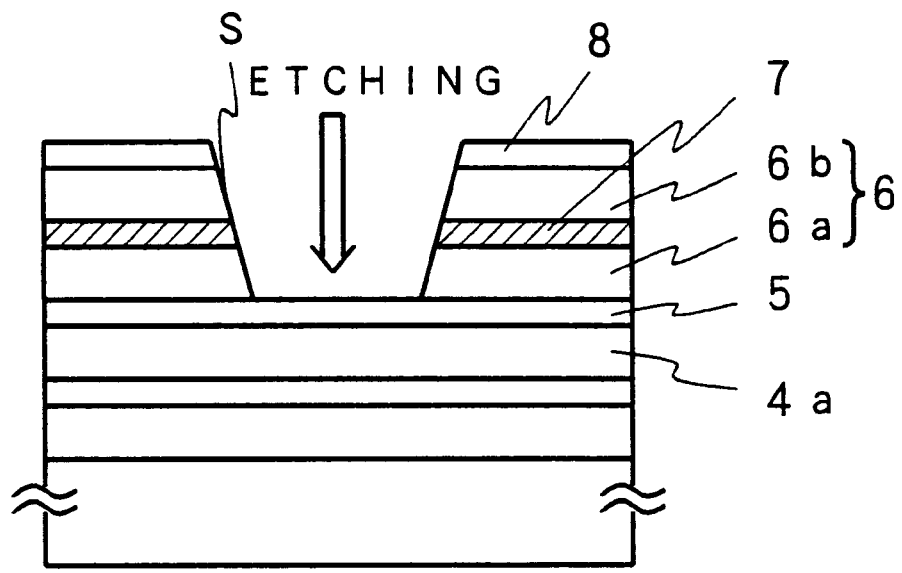
Figure 2:
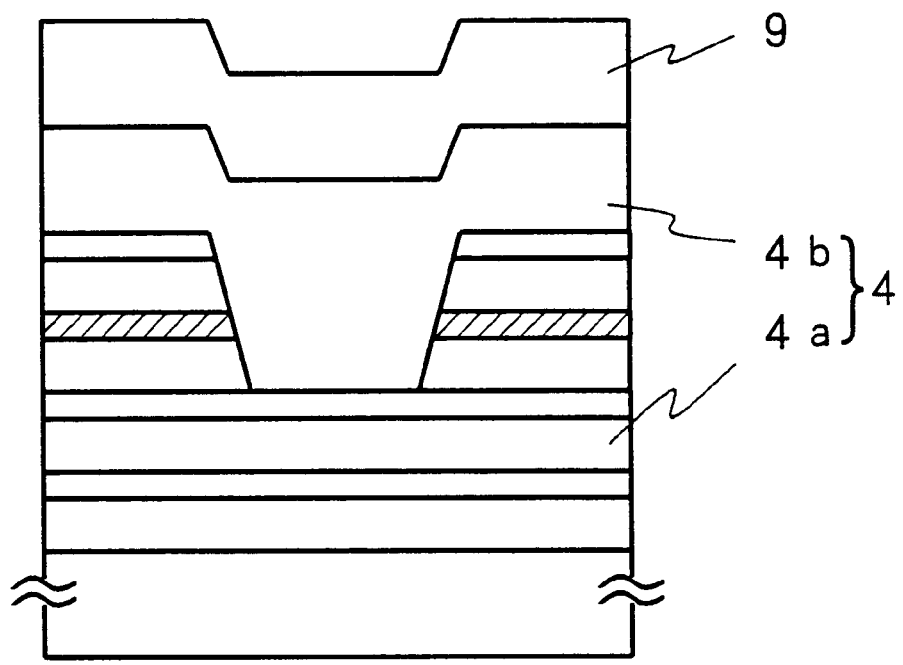

Referring to FIG. 2(a), an n-type GaAs semiconductor substrate 1 is first prepared for growing epitaxial layers thereon by an MOCVD or MBE method. A cladding layer 2 is formed of n-type $Al_{0.5}Ga_{0.5}As$ to a layer thickness of approximately 1 μm over the surface of the substrate 1. Then an active layer 3 is formed of a non-doped $Al_{0.15}Ga_{0.85}As$ to a layer thickness of approximately 0.1 μm on the cladding layer 2. Thereafter a first cladding layer 4a is formed of p-type $Al_{0.5}Ga_{0.5}As$ to a layer thickness of approximately 0.15 μm on the active layer 3. An etch stop layer 5 is then formed of a non-doped $In_{0.5}Ga_{0.4}Al_{0.1}P$ to a layer thickness of approximately several tens of nm (nanometer) on the cladding layer 4a. Thereafter a first current blocking layer 6a is formed of n-type $Al_{0.6}Ga_{0.4}As$ to a layer thickness of approximately several tens of nm on the etch stop layer 5. On the first current blocking layer 6a, an over-saturation absorbing layer 7 is formed of non-doped $Al_{0.15}Ga_{0.85}As$ to a layer thickness of approximately several tens of nm. Then a second current blocking layer 6b is formed of n-type $Al_{0.6}Ga_{0.4}As$ to a layer thickness of approximately 0.5 μm on the over-saturation absorbing layer 7. Subsequently, an oxidation preventive layer 8 is formed of n-type GaAs to a layer thickness of approximately 0.03 μm on the second current blocking layer 6b.

Then, as shown in FIG. 2(b), the substrate having thereon layers thus grown is taken out of the reactor vessel, e.g., the MOCVD apparatus, to be masked by photoresist at a top surface excepting a stripe groove forming portion. The masked substrate is subjected to etching by a solution based on a sulfuric acid to provide a stripe groove S. With this solution, there occur almost no etching on the $In_{0.5}Ga_{0.4}Al_{0.1}P$ material so that the etching is stopped by the etch stop layer 5. Thus, the current blocking layer 6 and the over-saturation absorbing layer 7 are selectively etched away by a predetermined width without etching the first cladding layer 4a.

Then the substrate thus etched is again placed in the reactor vessel, and a second cladding layer 4b is formed of p-type $Al_{0.5}Ga_{0.5}As$ to a layer thickness of approximately 1 μm over the substrate in a manner filling the stripe groove S, as shown in FIG. 2(c). Subsequently, a contact layer 9 is formed of p-type GaAs to a layer thickness of approximately 1 μm on the second cladding layer 4b. Thereafter, a conductor metal is evaporated onto the top and bottom surfaces, i.e., the surface of the contact layer 9 and the back surface of the substrate 1, thereby forming top and bottom electrodes, not shown. After forming the electrodes, the substrate thus processed is divided for example by cleavage into individual chips, thus providing a semiconductor laser device of the invention.

By utilizing the method of manufacture as stated, it is possible to provide a semiconductor laser device through two times of successive growth in a simple manner, with an advantage of reduced manufacturing cost at improved chip yield.

Figure 3:
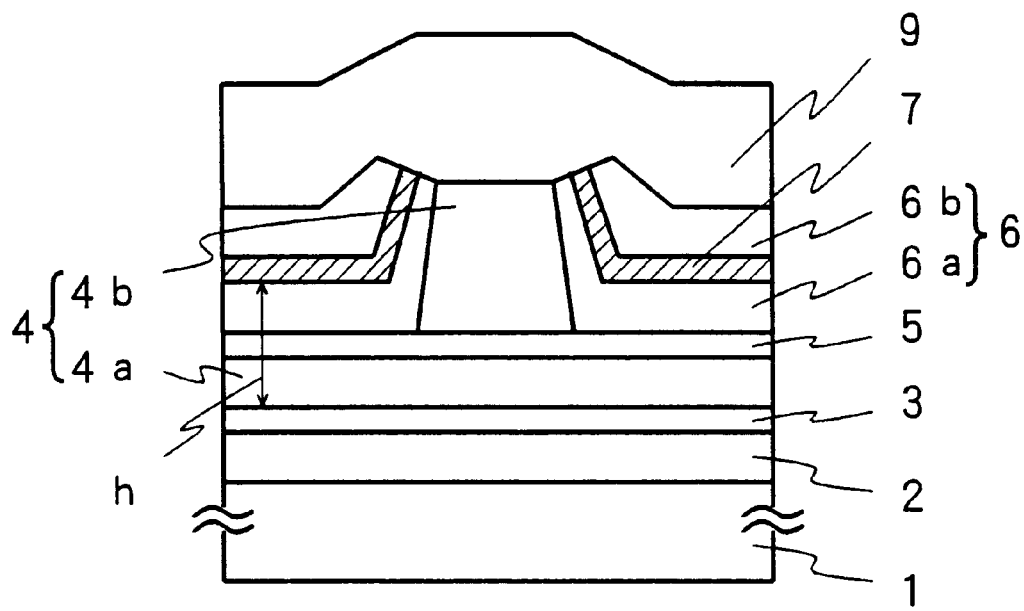
FIG. 3 is a sectional view of a semiconductor laser device according to another embodiment of the present invention.
Figure 4:
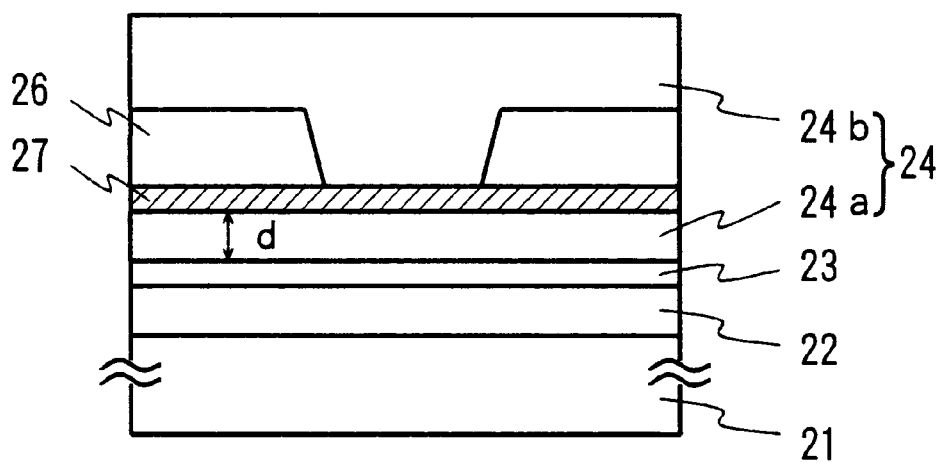
FIG. 4 is a sectional view of a conventional semiconductor laser device.
Figure 5:
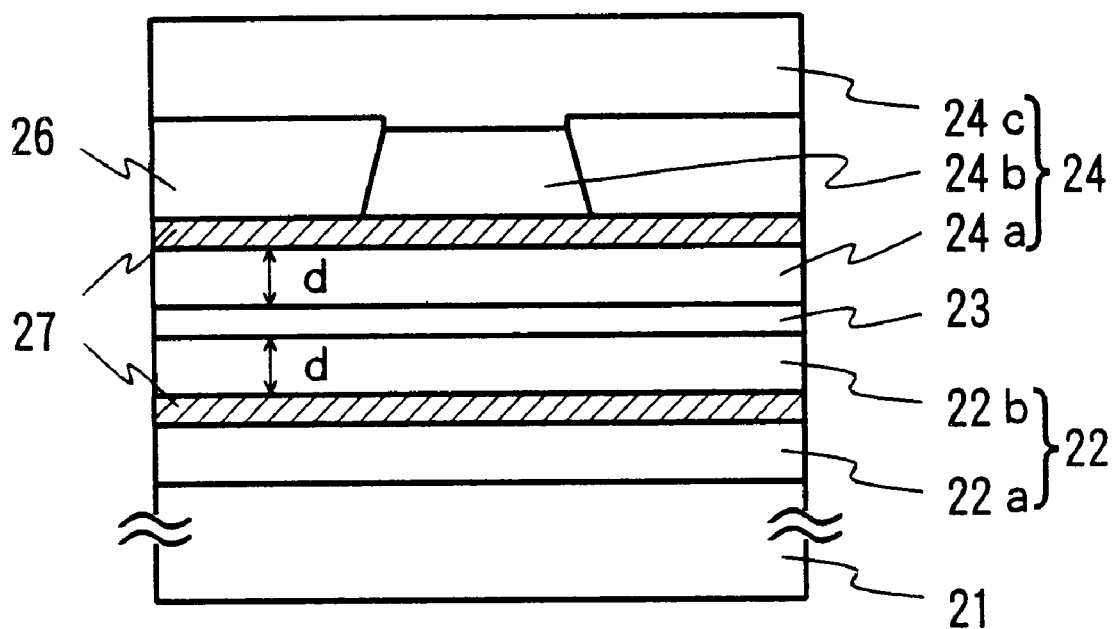
FIG. 5 is a sectional view of a conventional semiconductor laser device.

FIG. 3 is a sectional view, similar to FIG. 1, of another embodiment of a semiconductor laser device of the present invention. The structure of FIG. 3 is different from that of FIG. 1 solely in respect of structure and forming method of its current blocking layer 6 (6a, 6b) that defines a current injecting region. However, this example also has a current blocking layer 6, similarly to the structure of FIG. 1, that is greater in forbidden band gap than that of the active layer 3 and lower in refractive index than that of the second conductivity type cladding layer 4, and wherein an over-saturation absorbing layer 7 is formed, in a current blocking layer 6, of such a material that has almost the same forbidden band width as that of the active layer 3. In this embodiment, the same or similar elements or parts are denoted by the same or similar reference characters, omitting explanations thereof.

In the FIG. 3 embodiment, the second cladding layer 4b is formed thick and then etched to provide a recess at locations on the respective sides of a stripe groove providing a current injecting region. Note that the processes of layer formations and etching is carried out on a wafer or an undivided substrate and accordingly the recesses are defined between current injecting regions of the adjacent chips (devices) to be divided. In the recesses are formed a first current blocking layer 6a, an over-saturation layer 7 and a second current blocking layer 6b, in this order. Before forming the current blocking layers 6a, 6b and the over-saturation absorbing layer 7, a mask of $SiO_2$ for example is formed on a surface of the second cladding layer 4b at only a stripe groove portion left. After the above-stated layers are sequentially formed, the mask is removed. By doing so, the current blocking layer 6 and the over-saturation absorbing layer 7 are provided only in the recesses of the substrate under processing.

Owing to the method of manufacture as above, three steps of growth are required. However, there is obtained an advantage that the resulting semiconductor device is excellent in reliability due to the provision of an interface of regrowth located distant from the active layer.

In the present invention, since the distance between the current blocking layer(s) and the active layer are controlled sufficiently narrow, the current density for the active layer can be increased sufficiently high. Consequently, the operating current is suppressed to a low level with its threshold value suppressed low.

Since the over-saturation absorbing layer is provided at such a distance from the active layer that causes self-excited oscillation while realizing a low operating current (lowered threshold value), it is possible obtain a semiconductor laser device wherein the longitudinal mode is to be shifted into the multi mode, return-beam noises are prevented for low noise characteristic, and the astigmatism is sufficiently reduced.

Furthermore, the etch stop layer of the invention is provided independently of the over-saturation absorbing layer, so that it is not limitative of material and to be formed of a different material from that of the current blocking layer. The etch stop layer is high in freedom of selecting a material therefore. It is therefore possible to select an etch stop layer as well as an etching solution that are high in controllability in the manufacture process of a semiconductor laser device, contributing to large-scaled production with reduced manufacture cost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device comprising:
    (a) a double-hetero structure having an active layer sandwiched between a first conductivity type cladding layer and a second conductivity type cladding layer, one of said first and second conductivity type cladding layers being formed by a first cladding layer and a second cladding layer;
    (b) a current blocking layer provided between said first cladding layer and said second cladding layer, and formed of a material having a forbidden band gap wider than that of said active layer and a refractive index lower than that of said one cladding layer, said current blocking layer being formed with a current injecting region having a conductivity type different from that of said one cladding layer; and
    (c) an over-saturation absorbing layer formed in said current blocking layer, said over-saturation absorbing layer is formed of such a material that has approximately the same forbidden band gap as that of said active layer.

2. A semiconductor laser device according to claim 1, further including an etch stop layer formed of a material having a forbidden band gap wider than that of said active layer between said current blocking layer and said first cladding layer, said etch layer being etchable at an etching rate lower than those of said current blocking layer and said over-saturation absorbing layer when using an etching solution for etching said current blocking layer and said over-saturation absorbing layer.

3. A semiconductor laser device according to claim 1, wherein said active layer is formed in a quantum well structure.

4. A semiconductor laser device comprising:
    a first conductivity type semiconductor substrate;
    a first conductivity type cladding layer formed on said first conductivity type semiconductor substrate;
    an active layer formed on said first conductivity type cladding layer;
    a second conductivity type cladding layer formed on said active layer;
    a first conductivity type first current blocking layer, an over-saturation absorbing layer and a first conductivity type second current blocking layer formed in the order in said second conductivity type cladding layer to have a stripe groove formed therein;
    wherein said first and second current blocking layers are formed of a material having a forbidden band gap wider than that of said active layer and a refractive index lower than that of said second conductivity type cladding layer; and
    said over-saturation absorbing layer being formed of a material having a forbidden band gap approximately equivalent to that of said active layer.

5. A semiconductor laser device according to claim 4, wherein said cladding layers are formed of $Al_xGa_{1-x}As$ ($0.4 \leq x \leq 0.6$), said active layer being formed of $Al_pGa_{1-p}As$ ($0 \leq p \leq 0.3$), said current blocking layers being formed of $Al_qGa_{1-q}As$ ($0.5 \leq q \leq 0.8$, $p<q$, $x<q$), and said over-saturation absorbing layer being formed of $Al_rGa_{1-r}As$ ($0 \leq r \leq 0.3$, p and r are approximately equivalent).

6. A semiconductor laser device according to claim 5, further including an etch stop layer formed of an InGaAlP-base material between said first current blocking layer and said second conductivity type cladding layer.

7. A semiconductor laser device comprising:
    a first conductivity type semiconductor substrate;
    a first conductivity type cladding layer formed on said first conductivity type semiconductor substrate;
    an active layer formed on said first conductivity type cladding layer;
    a second conductivity type cladding layer formed on said active layer;
    a current injecting region formed by selectively removing said second conductivity type cladding layer at an upper portion on respective sides;
    a first conductivity type first current blocking layer, an over-saturation absorbing layer and a first conductivity type second current blocking layer formed on the respective sides of said current injecting region;
    wherein said first and second current blocking layers are formed of a material having a forbidden band gap wider than that of said active layer and a refractive index lower than said second conductivity type cladding layer; and
    said over-saturation absorbing layer being formed of a material having a forbidden band gap approximately equivalent to that of said active layer.

8. A semiconductor laser device according to claim 7, wherein said second cladding layer is formed by a second conductivity type first and second cladding layers, an etch stop layer being formed between said second conductivity type first and second cladding layers, and said second conductivity type second cladding layer being removed on the respective sides of said current injecting region, and said current blocking layer and said over-saturation absorbing layer being overlaid on said etch stop layer which is exposed by removing said second cladding layer.

9. A semiconductor laser device according to claim 7, wherein said cladding layers are formed of $Al_xGa_{1-x}As$ ($0.4 \leq x \leq 0.6$), said active layer being formed of $Al_pGa_{1-p}As$ ($0 \leq p \leq 0.3$), said current blocking layers being formed of $Al_qGa_{1-q}As$ ($0.5 \leq q \leq 0.8$, $p<q$, $x<q$), and said over-saturation absorbing layer being formed of $Al_rGa_{1-r}As$ ($0 \leq r \leq 0.3$, p and r are approximately equivalent).

10. A semiconductor laser device according to claim 9, wherein said second cladding layer is formed by a second conductivity type first and second cladding layers, an etch stop layer being formed of an InGaAlP-base material between said second conductivity type first and second cladding layers.

* * * * *